Nov. 6, 1962 M. BAKER 3,061,911

METHOD OF MAKING PRINTED CIRCUITS

Filed Jan. 31, 1958

INVENTOR.
Mitchell Baker

BY Norman E. Schroeder

ATTORNEY 3,061,911
METHOD OF MAKING PRINTED CIRCUITS
Mitchell Baker, Rochester, N.Y., assignor to Xerox Corporation, a corporation of New York
Filed Jan. 31, 1958, Ser. No. 712,355
8 Claims. (Cl. 29—155.5)

The present invention relates to improvements in electric circuit construction and, particularly, to an improved method for producing electrical apparatus of the printed circuits type.

Printed circuits and their fabrication are well known, and essentially they consist of a dielectric substrate plate coated with a conductive material to form electrical conducting lines. The advantages of this type of printed circuit panel are generally known. However, in prior printed circuits, it has been customary to include passive circuit elements, such as resistors, condensers and transistors, as prefabricated components, these component elements being attached to the conductor lines of a printed circuit panel as by soldering.

Heretofore, conductor lines have been made by various etching processes, that is, the connecting lines for a circuit have been made by selectively etching a completely metal clad substrate plate. In this method, the metallized surface is coated with an acid resistant material, commonly called "resist," so that the desired circuit areas are covered. The unprotected metal areas are then completely removed in a chemical etching bath. In the Albright et al. Patents 2,777,192 and 2,777,193 there is disclosed a method for making a printed circuit panel having conductor lines and soldering terminals formed by a double etching process. Prior to the present invention, only conductive lines, that is, conductors and terminal connections, have been formed by any of the known etching processes, and therefore it has been necessary to add passive circuit elements to a printed circuit panel formed by an etching process, as separate prefabricated elements.

The present invention contemplates the formation of passive circuit elements, such as resistor elements, as an integral part of the printed circuit thereby eliminating some or all of the separate resistor components normally soldered to prior printed circuits. This not only reduces the number, or eliminates completely the number of separate resistor components that must be stocked, but it eliminates the separate handling and soldering of the resistor components while at the same time providing a more compact printed circuit.

It is an object of the present invention to form a printed circuit containing not only the usual conductor lines and soldering terminals but in addition passive circuit elements, such as resistor components, as an integral part of the circuit.

The invention is further characterized by the novel manner in which the printed circuit including the resistor components is produced and in which the association of circuit components, the resistor elements and conductor elements is accomplished.

To achieve these general objects and characteristic features, the method of the invention is applied to a substrate plate or base of a dielectric material clad first with a layer of material having the desired order of resistivity to form the resistive circuit elements of the particular circuit to be formed and then with a layer of conductive material, and constitutes a process wherein the layers of material are selectively and successively etched to form the desired resistor and conductor elements of the printed circuit. In this manner all of the resistors can be made an integral part of the basic printed circuit; however, it is obvious, that where desired, special resistors can be added to the circuit as separate components in the usual manner.

The invention will be more clearly understood from the following description, reference being made to the accompanying drawings wherein.

Figure 2:
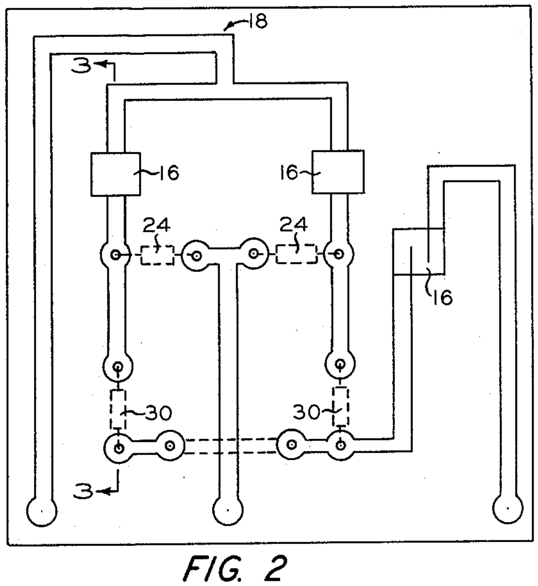
FIG. 2 is a plan view of a printed circuit panel containing part of the circuit of FIG. 1 constructed in accordance with the invention.
Figure 3:
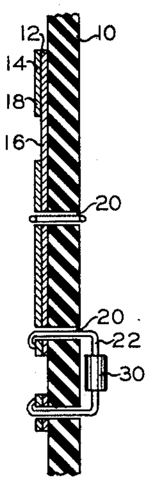
FIG. 3 is a cross-sectional view taken substantially on line 3—3 of FIG. 2.
Figure 10:
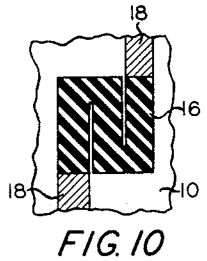

FIGS. 4 to 9, inclusive, are a portion of a printed circuit illustrating successive steps in the process or method of producing the printed circuit panel as shown in FIGS. 2 and 3; and FIG. 10 is a plan view of a modified resistor showing a pattern for increasing resistance.

It is pointed out that the various figures are merely illustrative and are not intended to be limited to any specific circuit, and that the thickness of certain elements have been exaggerated for clarity of illustration.

Figure 1:
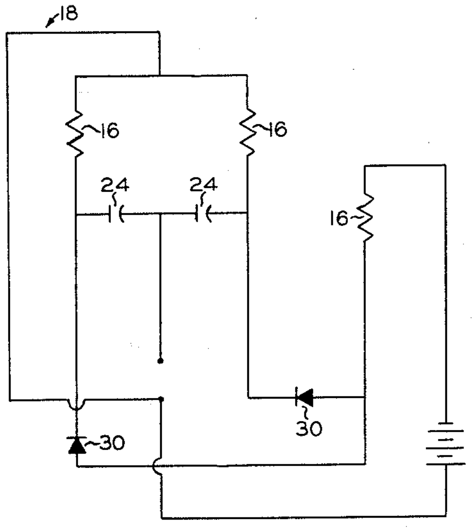
FIG. 1 shows a schematic circuit diagram of a typical negative resistance flip flop circuit.

With more particular reference to the drawings, FIG. 1 shows a schematic circuit diagram wherein conductor lines are identified by reference character 18, resistors by 16, capacitors by 24 and selenium diodes 30. The printed circuit construction shown in FIGS. 2 and 3 includes a substrate plate or base 10 made from any suitable dielectric material plated with a layer of electrical resistance material 12 and a layer of electrically conductive material 14, the resistance material being suitably bonded to one side of the substrate plate or base 10, and the conductive material 14 being suitably bonded to the resistance material so that both materials become permanently joined together to form a unitary laminated structure. The resistive and conductive materials are removed to form the desired resistor 16 which consist solely of the resistance material 12 while the laminate of resistance material 12 and conductive material 14 forms the conductor lines 18 of the printed circuit. The substrate plate or base is perforated as at 20 so that the wire leads 22 of components such as diode 30 may be inserted therethrough to be connected to the conductor lines in the usual manner.

Figures 4, 5, 6, 7, 8, 9:
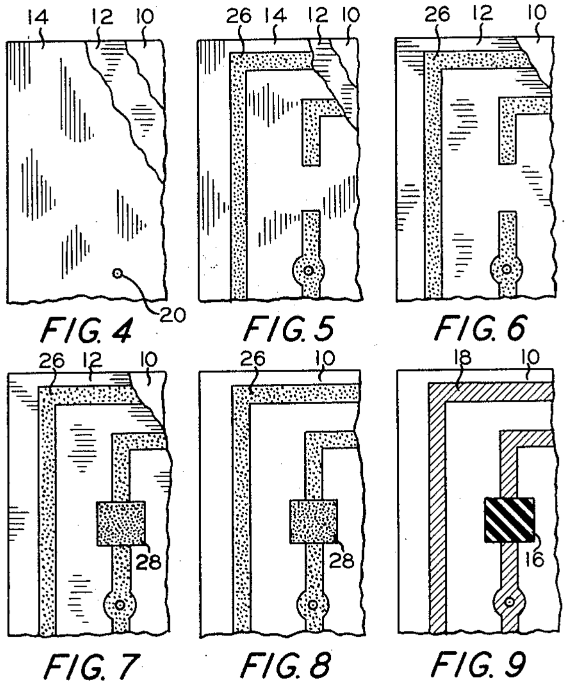

The method of producing the printed circuit will be best understood by referring to FIGS. 4 to 9, inclusive, wherein FIG. 4 illustrates the dielectric substrate plate or base 10, the surface of which is first plated with a material 12 having the desired order of resistivity and then plated with a layer of conductive material. Although FIG. 4 illustrates that the substrate plate or base is perforated as at 20, it is clear that the plate can be perforated before or after plating the substrate. A suitable resist image 26 of the conductor lines to provide the desired circuitry is then applied to the outer layer of material as illustrated in FIG. 5. The application of the pattern may be done xerographically, by means of silk screening or other suitable process. The coated base is treated as by etching to remove the unprotected conductive material as in FIG. 6. A resist image 28 of the resistor pattern is then applied to the resistive layer of material as in FIG. 7. The coated base is then treated, as by etching, to remove the unprotected resistive material as indicated in FIG. 8. The resist material is then removed in any suitable manner to expose the desired circuitry consisting of conductor lines 18 and resistors 16 on base 10. Circuit components are then mounted to the panel in the usual manner. In making the printed circuit herein described it is obvious that there are desired limits to which the resistive material is plated. With this parameter held constant, various resistance values can be obtained by altering the length and width dimensions of the resistor, but the practical limit of this method yields only about a 100 fold range. To allow for a wider range of resistance values the plated resistive film can be removed in the pattern shown in FIG. 10 to provide for an increased resistance path.

Two specific methods well adapted for making printed circuit panels containing resistors and conductors formed-in-place suitable for use at high temperatures, in accordance with the invention will now be described.

A glass or ceramic substrate plate or base 10 heated to a temperature of about 550° C. is sprayed with a solution of acetone and tin chloride upon its surface. The resulting metal oxide layer or film of tin oxide formed on the substrate plate or base 10 is a resistive film generally referred to as "NESA," a trade name of the Pittsburgh Plate Glass Company. The tin oxide coated glass or ceramic substrate plate is then electroplated with copper to form a double layer circuit board containing a layer of electrical resistance material tin oxide 12 and a layer of electrical conductive material (copper) 14. After the copper electroplating, a positive image 26 of the desired conducting lines is placed over the copper film by a xerographic process. This consists of developing in a toner resist powder the desired image on a xerographic plate. A transparent paper is then placed over the image, and when a positive charge is placed on the back of the paper, the image is transferred to the paper. This paper with the image thereon is placed over the copper film and a negative charge is applied which forces the resist toner to the plate. The image is then fused in place by exposing it to trichloroethylene vapor. The unprotected copper is removed by dipping the plate in ferric chloride solution. Without removing the first resist image, an image of the resistor pattern is applied xerographically as explained above to protect the desired areas of tin oxide to determine resistor geometry. The whole surface of the circuit board is then covered with zinc powder and then dilute hydrochloric acid is applied to the zinc to remove the unprotected tin oxide film. The finished printed circuit plate is then rinsed and cleaned. In the above described process, the ferric chloride does not affect the tin oxide, the zinc and hydrochloric acid does not affect the copper, and neither etching solution reacts to, penetrates, nor undermines the resist toner.

In the above described process the resistive film was sprayed onto the substrate plate or base, while the conductive film was electroplated to the resistive film. Another method of making a printed circuit will now be described in which both the resistive film and the conductive film are formed on the substrate plate or base by a vacuum plating process.

In the second embodiment of the invention, a glass or ceramic substrate plate or base 10 is cleaned and then mounted in a vacuum chamber and then the chamber is evacuated. An internal heater is used to heat and maintain the substrate plate or base at a temperature of say 350° C. Chromium is then evaporated to produce a uniform 100 ohm-sq. film 12 on the substrate plate or base. When a monitoring resistor indicates a resistivity of 100 ohm-sq., the evaporation of copper is commenced. Subsequent to a short period of simultaneous evaporation which produces a thin layer of chromium-copper, the chromium evaporation is stopped and the copper evaporation is carried to completion to form film 14. The mixed layer of chromium and copper is required to produce desirable bonding characteristics, but it is not shown in the drawing since it has no particular significance to this invention. Air is then admitted to the vacuum chamber and the plated substrate plate or base is removed from the chamber. After removal from the vacuum chamber a positive image 26 of the conducting lines is placed over the copper film by a xerographic process. This consists of developing in a toner resist powder the desired image on a xerographic plate. Then a transparent paper is placed over the image and when a positive charge is placed on the back of the paper, the image is transferred to the paper. This paper with the image thereon is placed over the copper film and a negative charge is applied which forces the resist toner to the plate. The image is then fused in place by exposing it to trichloroethylene vapor. The unprotected copper is removed by dipping the plate in ferric chloride solution. Without removing the first resist image, an image of the resistor pattern is applied xerographically as explained above. The unprotected chromium is removed by covering the plate with fine zinc powder and then spraying hydrochloric acid over the plate.

A circuit panel formed in either manner described above may be used without further steps by making use of the toner resist as a protective coating, or the toner resist may be removed with trichloroethylene and another protective coating deposited, such as a layer of silicon monoxide or magnesium monoxide. Components may be added to the circuit panel in the normal manner.

The printed circuit made in accordance with the above described processes consists of conducting lines formed by a film of either tin oxide or chromium and a film of copper. There are two reasons for using this type of composite film. First, the copper portion provides a film having high conductivity and which is easily soldered, and secondly, portions of the underlying tin oxide or chromium film are used to form the resistors. The resistors in the printed circuit consist of a film of tin oxide or chromium of the proper shape and size to provide the desired resistive values. Component parts necessary to complete a desired circuit may be added to the printed circuit in the usual manner by soldering to the copper conductors. Although the printed circuit has been described and illustrated as being formed on only one side of the substrate plate or base it appears obvious that the process can be applied to form circuits on both sides of the substrate plate or base, and that different resistivity films can be applied to opposite sides of the substrate plate to increase the range of resistors which may be cut.

It also appears obvious that the above described processes can readily be adapted for in-place fabrication of other passive circuit elements such as capacitors and condensers.

The above described processes are well suited to form printed circuit panels for use in equipment capable of operation in ambients of elevated temperature. In this respect, it is advisable to use a ceramic substrate plate for operational requirements above 300° C., while glass is a suitable substrate material for operational temperatures up to 300° C.

While the present invention, as to its objects and advantages, has been described herein as carried out in specific embodiments thereof, it is not desired to be limited thereby but it is intended to cover the invention broadly within the spirit and scope of the appended claims.

What is claimed is:

1. The method of forming a printed circuit panel containing resistors and conductors, which method includes the steps of forming a laminated structure by bonding to one side of a dielectric substrate plate an etchable layer of resistive material and bonding on said layer of resistive material an etchable layer of conductive material, fixing a positive resist image of conducting lines on said layer of conductive material, etching the exposed portion of the conductive material layer to remove the unprotected conductive material, fixing a positive resist image of the resistors on said layer of resistive material and etching the exposed portion of the resistive material layer to remove the unprotected resistive material.

2. The method of claim 1 wherein said resistor material is tin oxide and said conductive material is copper.

3. The method of claim 1 wherein said resistive material is chromium and said conductive material is copper.

4. The method of forming a printed circuit panel containing resistors and conductors, which method includes the steps of plating to one side of a heated dielectric substrate plate a layer of tin oxide and then a layer of copper, fixing a positive resist image of conducting lines on said layer of copper, etching the exposed portion of the copper layer with ferric chloride solution to remove the unprotected copper, fixing a positive resist image of the resistor on said layer of tin oxide, and etching the exposed portion of the tin oxide layer by applying zinc powder and then diluted hydrochloric acid to said tin oxide thereby removing the unprotected tin oxide.

5. The method of forming a printed circuit panel containing resistors and conductors, which method includes the steps of plating to one side of a heated dielectric substrate plate a layer of chromium and then a layer of copper, fixing a positive resist image of conducting lines on said layer of copper, etching the exposed portion of the copper layer to remove the unprotected copper, fixing a positive resist image of the resistors on said layer of chromium and etching said layer of chromium to remove the unprotected chromium.

6. The method of forming a printed circuit panel containing resistors and conductors, which method includes the steps of plating one side of a heated dielectric substrate plate with a layer of chromium and then a layer of copper, fixing a positive resist image of conducting lines on said layer of copper, removing the unprotected copper by dipping said plate in a ferric chloride solution, fixing a positive resist image of the resistors on said layer of chromium and etching the exposed portion of the chromium layer by spraying with hydrochloric acid to remove the unprotected chromium, thereby forming conductive lines of chromium and copper and resistors of chromium on said substrate plate.

7. The method of forming a printed circuit from a laminated structure having an insulating base with an etchable layer of resistance material from which resistors may be formed and an etchable layer of conductive material from which conductor lines may be formed, which method includes fixing a positive resist image of conducting lines on said layer of conductive material, etching the exposed portion of the conductive material layer to remove the unprotected conductive material, fixing a positive resist image of resistors on said layer of resistance material, and etching the exposed portion of the resistance material to remove the unprotected resistance material.

8. The method of forming a printed circuit panel containing resistors and conductors, which method includes the steps of forming a laminated structure by bonding to one side of a dielectric substrate plate an etchable layer of resistance material and an etchable layer of conductive material, applying a toner resist image of conductor lines xerographically on said layer of conductive material, fusing said toner resist image of said conductor lines, etching the exposed portion of said layer of conductive material to remove unprotected conductive material, applying xerographically a toner resist image of resistors of said layer of resistance material, fusing said toner resist image of said resistors, and etching the exposed portion of said layer of resistance material to remove unprotected resistance material.

References Cited in the file of this patent

UNITED STATES PATENTS

| | | |
|---|---|---|
| 2,662,957 | Eisler | Dec. 15, 1953 |
| 2,721,152 | Hopf | Oct. 18, 1955 |
| 2,721,153 | Hopf | Oct. 18, 1955 |
| 2,777,193 | Albright et al. | Jan. 15, 1957 |
| 2,877,388 | Reid et al. | Mar. 10, 1959 |
| 2,910,351 | Szpak et al. | Oct. 27, 1959 |